Aug. 2, 1960 F. B. MAYNARD ET AL 2,947,925

TRANSISTOR AND METHOD OF MAKING THE SAME

Filed Feb. 21, 1958

INVENTORS.
Fred B. Maynard
Earl L. Steele
BY
Mueller & Aichele
Atty's

United States Patent Office 2,947,925
Patented Aug. 2, 1960

2,947,925

TRANSISTOR AND METHOD OF MAKING THE SAME

Fred B. Maynard and Earl L. Steele, Phoenix, Ariz., assignors to Motorola, Inc., Chicago, Ill., a corporation of Illinois Filed Feb. 21, 1958, Ser. No. 716,666

20 Claims. (Cl. 317—235)

This invention relates generally to semiconductor devices, and more particularly to transistors adapted for use in both high frequency and high speed switching applications in operations at moderately high power levels. This invention also relates to an improved method of fabricating such transistors.

High frequency transistors of the so-called PNIP type have been provided wherein a zone of intrinsic semiconductor material in the die or wafer between the base layer and the collector provides a space charge or barrier region created by the biasing of the collector electrode and leading to low collector capacitances. Such low collector capacitance serves to improve the performance of the transistor for high-frequency applications. The space charge region extends from the collector partly across the semiconductor die of the transistor toward the emitter. Carriers ejected from the emitter are accelerated as they reach the space charge region but move relatively slowly through the base layer. For quick transit time, therefore, it is desirable that the space charge region approach the emitter closely without reaching it. Transistors of the PNIP type have not been entirely satisfactory in switching applications because they are characterized by undesirably slow recovery times when there is a low potential difference between the emitter and the collector of the unit. Such a condition exists when a low collector voltage is applied or when the transistor is in saturation. The space charge does not spread completely across the intrinsic zone and so the base region is effectively widened thus increasing the distance through which carriers from the emitter pass by relatively slow diffusion processes and so increasing storage time. This characteristic limits the range of application of such transistors for switching purposes, since they are slow acting when operating in saturation or at low collector voltages.

Another type of transistor which has been employed for high frequency operation is the so-called diffused base transistor in which a low-resistivity surface layer of a given conductivity type and of graded impurity concentration is formed by diffusion. This layer is used as the base layer of the transistor. The collector region is formed of the substrate layer, also of low resistivity, to which the diffusant has not penetrated. An emitter region is formed on the base layer by alloying. Transistors of this type may be made with a very thin base region which is desirable for high frequency operation. However, these transistors have been characterized by a low "punch-through" voltage which means that the space charge layer associated with the biased collector junction covers the entire base layer and reaches the emitter even when relatively low voltage is applied to the transistor. Therefore, it had been thought necessary to provide a relatively thick base layer to obtain desirably high punch-through voltage even though a thin layer is preferable for transistors intended to have good high frequency response. Because of their low punch-through voltage, such transistors have not been useful at high collector voltages which limits their use in switching applications.

For both types of transistors mentioned as well as for conventional PNP alloyed junction transistors, the effective width of the base region varies with changes in collector voltages and causes changes in various device parameters such as current gain. For some applications, it is desirable to keep these parameters independent of collector voltage.

As is the case with transistors generally, it is desired to provide high speed switching transistors in units as diminutive and compact as possible. Space conservation is often an important objective in the design of such devices as computers in which switching transistors are used. Desirably, such transistors must be both small and at the same time capable of mass production with high yield of satisfactory units.

It would be highly desirable to employ high speed switching transistors in medium power ranges. In such applications, a substantial amount of heat may be formed during operation. Unless this heat is effectively dissipated to the ambient atmosphere or elsewhere, the temperature of the unit itself may be undesirably raised and its operating characteristics adversely affected. For this reason, the semiconductor unit of the transistor should be mounted in such a way as to provide adequate heat transfer from the junction regions. Preferably, this should be accomplished without the use of complicated and expensive heat transfer means, but rather by utilizing relatively simple component parts which are easy and economical to fabricate and assemble, while at the same time providing satisfactory heat dissipation.

It is an object of the present invention to provide a transistor particularly useful both in high frequency operations and for high speed switching applications while at the same time operating effectively at both high and low collector voltages.

It is another object of the invention to provide a transistor characterized by low collector capacitance, and by small and stable collector saturation currents, and therefore, particularly adapted to high frequency applications.

It is another object of the invention to provide a transistor whose structure is such that it can be economically mass-produced with uniform electrical characteristics for successive units manufactured.

It is another object of the invention to provide a transistor with efficient heat dissipating characteristics which is capable of relatively high voltage operation at medium or higher power levels.

It is still another object of the invention to provide a method of fabricating a semiconductor die which facilitates the making of a transistor unit having a small collector capacitance. This is accomplished by the isolation of a collector region which forms a small area diffused rectifying junction with the base region of the semiconductor die.

A feature of the invention is the provision of a transistor having a small, electrically isolated collector region forming a small area diffused collector junction so that the unit is characterized by low collector capacitance, and as a result is particularly adapted for high frequency applications.

Another feature of the invention is the provision of L-shaped heat dissipating members for a transistor, with each such member having one of its legs connected to a base connector strip on which the semi-conductor die of the transistor is mounted and with the other leg connected to the top surface of a mounting base to provide an effective heat sink. The heat dissipating members permit satisfactory operation of the transistor in the medium power range by furnishing adequate heat transfer from the junction regions of the transistor.

Another feature of the invention is a provision in a semiconductor die of a rectifying collector junction between a collector region of relatively high and uniform resistivity and a base region whose resistivity is graded to a lower value away from the junction. As a collector voltage is applied, the space charge region spreads preferentially from the junction into the high resistivity collector region. Even at relatively high collector voltages, this region will not extend across the graded base to the emitter to cause punch-through or to reduce effective base width. On the other hand, if a low collector voltage is used the base region will still extend only to the rectifying junction and is not widened so that transit time of carriers from emitter to collector is not prolonged. Thus, the transistor has an effective base width that is relatively independent of the collector voltage and operates effectively over a relatively wide collector voltage range.

Still another feature of the invention is the provision of a method of treating a diffused semiconductor body so as to form a cavity having a projection of semiconductor material of a particular conductivity type at its bottom and isolating the projection from other material of the same conductivity type within the body. The cavity is formed by jet-etching a surface of the body under carefully controlled conditions to produce a cavity with a convex bottom thus permitting the isolation of small collector region of predetermined cross-sectional area which forms a small area collector junction with an adjacent base region. The provision of the small isolated collector junction in turn contributes to desirably low collector capacitance for the device.

Figures 1, 2, 3, 4:
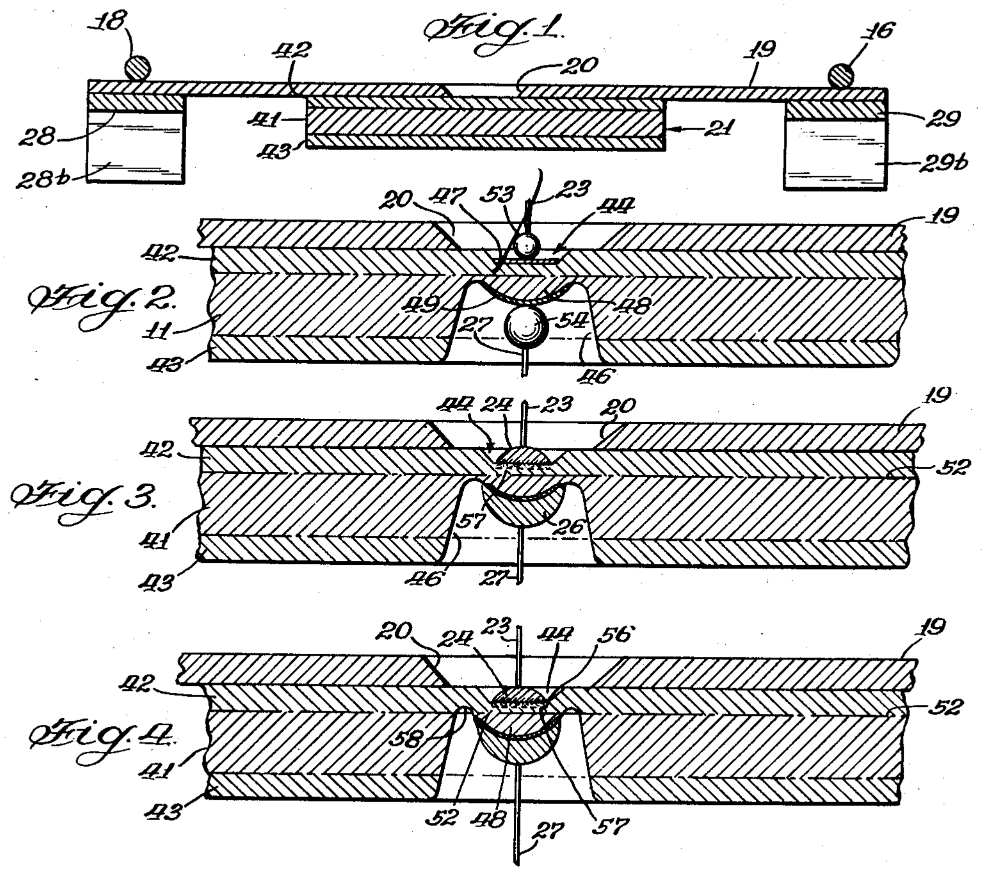
Fig. 1 is a view in cross-section showing a diffused semiconductor die mounted on a base connector strip which is attached to upright leads of a transistor mounting base.
Fig. 2 is a view in cross-section of the semiconductor die illustrated in Fig. 1 at a further stage in the transistor assembly process after suitable junction pits have been formed, and showing metal contacts in position for being affixed to the opposite faces of the die.
Fig. 3 is a view in cross-section showing the semiconductor die at a still further stage of the process with metal electrical contacts affixed to it within the cavities.
Fig. 4 is a view in cross-section showing the semiconductor die in the form which it has in a completed transistor.

In accordance with the present invention the semiconductor die used in making a high frequency, high speed switching transistor is made up of a layer of relatively high resistivity P-type semiconductor material and layers of lower resistivity N-type semiconductor material of graded resistivity formed, for example, by diffusion of a donor type impurity into the P-type substrate from both sides thereof. A small region of P-type semiconductor material is isolated from the rest of the P-type material in the die and forms a diffused collector junction with the N-type layer. The small isolated collector area enables the resulting transistor to have a desirably small collector capacitance. The juxtaposition of the high resistivity collector region and the graded resistivity base region results in a preferential spreading of the space charge region into the collector so that effective base width is relatively independent of collector voltage. In the embodiments of the invention employing germanium as the semiconductor material, a second region of P-type semiconductor material is formed by the alloying of indium and zinc into the N-type layer so that a ternary alloy of germanium, zinc and indium is formed as an emitter region.

In forming the aforesaid semiconductor die a semiconductor body with diffused layers on its opposite faces is treated to form junction cavities on those faces, preferably by a jet-etching method. A relatively shallow emitter cavity is etched into the diffused surface layer on the emitter side of the body while a cavity with a convex bottom is formed on the collector side extending through the diffused layer on the collector side into the substrate. A central projection of P-type substrate is then isolated from the main body of P-type material by forming a groove around the projection which groove extends into the N-type layer in which the emitter cavity has been formed. Jet-etching under controlled conditions provides a collector cavity of such contour that a central projection can easily be isolated and also facilitate the subsequent zinc plating of cavity bottoms. When employing a germanium semiconductor die, the emitter junction is formed by placing a small body of indium on the zinc coated bottom of the emitter cavity and directing a stream of hot inert gas into the cavity to melt the indium and cause localized alloying of zinc and indium with the underlying germanium so that a ternary alloy is formed within a predetermined region limited to the area directly beneath the zinc layer.

A completed transistor unit embodying the present invention includes the semiconductor die described attached to a conductive base strip which in turn is secured to one or more heat dissipating members. Each member is L-shaped with one leg thereof secured to the base strip and the other to the upper surface of a mounting base which serves as an effective heat sink. The L-shaped heat dissipating members permit the transistor to be operated at medium power levels because of their effectiveness in transferring heat generated at the transistor junctions to the ambient atmosphere.

Figure 6:
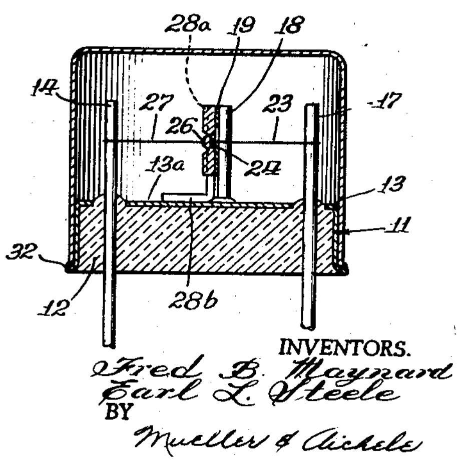
Fig. 6 is a view in section taken on the line 6—6 of Fig. 5.

In referring to the accompanying drawings, it is to be understood that all of the figures are illustrated on a greatly enlarged scale. For example, the overall outside diameter of the transistor unit illustrated in Fig. 6 is about 0.25 inch with the semiconductor die particularly illustrated in Figs. 1–4 being only about 0.005 inch in thickness. Although these and other dimensions specified in the course of the ensuing specification are included herein in order that the invention may be clearly understood in its proper context, it should also be understood that these dimensions are merely illustrative of a specific embodiment of the invention.

Figure 5:
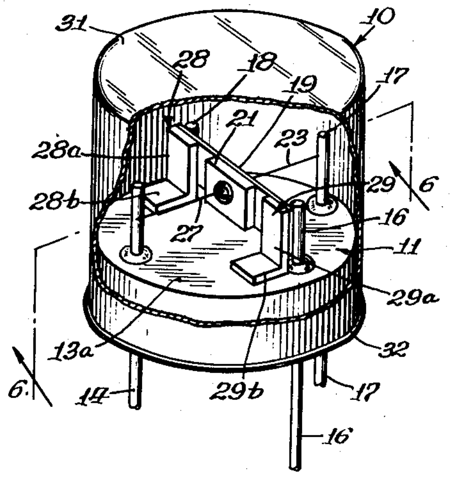
Fig. 5 is a perspective view of a transistor embodying the semiconductor die illustrated in Fig. 4 with the cover member of the transistor broken away to more clearly illustrate the method of mounting the semiconductor die unit.

Turning now specifically to the accompanying drawings, there is shown in Figs. 5 and 6 a completed transistor 10 in accordance with this invention. The transistor 10 includes a mounting base 11 which has a body portion 12 made of suitable insulating material such as glass or ceramic. Body portion 12 is held within conductive metal cover 13 which is made of a suitable alloy such as "Kovar" and carries a thin gold layer on its upper surface 13*a*. Upright mounting leads 14, 16, 17 and 18 are supported in the insulating body 12 and extend above the flat upper surface 13*a* of the mounting base. Openings are provided in surface 13*a* to accommodate the mounting leads and are of sufficient size to prevent short circuiting between the leads and the cover 13. A base connector strip 19 is soldered, welded or otherwise suitably electrically and mechanically secured at its ends to mounting lead 16 which serves as the base lead and to supporting lead 18 which serves no electrical function and extends only above the surface of the mounting base whereas the other leads 14, 16, 17 extend below the mounting base and are used for incorporating the transistor 10 into an electrical circuit.

A semiconductor die 21 is secured in ohmic connection to one side of the base strip 19 which has a central aperture 20 through which the emitter lead 23 extends and is secured as by soldering or welding to the emitter mounting lead 17. Emitter lead 23 is electrically connected to the indium emitter button 24 which is carried on one side of the semiconductor die 21 as will be more fully explained subsequently.

A collector contact button 26 on the opposite side of die 21 is connected to collector lead 27 which in turn is soldered to collector mounting lead 14.

A pair of L-shaped heat dissipating members 28 and 29 and each having a pair of legs 28*a*, 28*b* and 29*a*, 29*b* respectively, are connected in heat exchange relation to the base strip 19 adjacent its ends and to the top surface 13*a*. Member 28 is welded to the base connector strip 19 with the leg 28*b* soldered to the surface 13*a*. Likewise, the member 29 has its leg 29*a* welded to the base strip 19 and its leg 29*b* soldered to the surface 13*a*. The heat dissipating members 28 and 29 are relatively wide and thus form a relatively large area connection to the strip 19 serving to carry heat therefrom and dissipate it to the ambient atmosphere as well as to carry it to the metal cover 13 and thence to the insulating body 12 which combine to form an effective heat sink. The members 28 and 29 are made of nickel strip 0.078 inch wide and 0.0055 inch thick. The entire unit is enclosed in a cam or cover member 31 which is suitably connected as by welding to the mounting base 11 along the shoulder 32.

The transistor 10 is fabricated in a series of steps illustrated in Figs. 1–4. Fig. 4 especially shows the unique configuration of the semiconductor die 21 which contribute to the desirable electrical properties of the unit and permit its successful use in high frequency and high speed switching applications.

The semiconductor die 21 as particularly shown in Figs. 1–4 comprises a substrate layer 41 of germanium of P-type conductivity and of relatively high resistivity. Silicon or other semiconductor materials can be used in place of germanium. In accordance with one embodiment of this invention, the specific resistivity of the layer 41 is at least about 10 ohm-centimeters. Diffused layers 42 and 43 of N-type germanium have been formed by the diffusion of a donor type impurity into a body of P-type germanium. Although the layers 42 and 43 may be formed by the diffusion of any suitable donor-type impurity, in accordance with one specific embodiment of the invention, they are formed by the vapor diffusion of antimony. However, the particular method of diffusion employed forms no part of the present invention and any suitable method of forming a diffused PN junction including the use of other suitable donor-type impurities such as arsenic or phosphorous may be employed. The semiconductor die 21 is attached to the base connector strip 19 which is made of a thermally and electrically conductive material such as the alloy "Kovar" coated with a thin layer of tin. This is done by heating the strip 19 and the semiconductor die 21 by conduction to a temperature of about 600° C. with the strip 19 in contact with the N-type layer 42 to cause alloying between the tin and the germanium. The base connector strip 19 is provided with a central aperture 20 exposing a round portion of the layer 42 about 0.04 inch in diameter.

For a clear understanding of the invention it should be realized that various component parts of the transistor 10 are extremely small. In accordance with one specific embodiment of the invention the semiconductor die 21 is about 0.065 inch square and about 0.005 inch thick having been cut from a larger germanium crystal wafer which had been subjected to a suitable diffusion treatment. The diffused layers 42 and 43 are about 0.0006 inch thick. The base strip 19 is 0.078 inch wide, 0.210 inch long and 0.0055 inch thick. In order to facilitate handling of an object so small as the base strip 19 (and the semiconductor die 21 carried thereon) during assembly of the transistor 10, the strip 19 and the die 21 are connected to the mounting base 11 by welding the ends of the strip to mounting leads 16 and 18 respectively. The mounting lead 16 serves as the base lead in the completed transistor unit. Heat dissipating members 28 and 29 are welded to the sides of the base strip 19 opposite the leads 18 and 16 respectively with the legs 28*b* and 29*b* being soldered to the surface 13*a* of metal cover 13. This arrangement simplifies handling of the semiconductor die 21 during subsequent etching and alloying steps. However, the invention may be practiced by performing the etching and alloying steps on a die that is attached to a temporary base strip, and is subsequently detached and remounted.

After connection to the mounting base, the semiconductor die 21 is treated to form a pair of round junction pits 44 and 46 on the opposite faces thereof. Each of these pits has a characteristic size and contour which must be accurately controlled. These pits may be formed by suitable mechanical methods such as sandblasting, drilling, or ultrasonic cutting or by etching techniques employing suitable masks. However, in accordance with a specific embodiment of the invention the pits 44 and 46 are formed by jet-etching. In jet-etching, a jet stream of suitable electrolyte is directed onto a surface of a semiconductor die. An electric current is passed through the jet and through the die in a direction to establish an etching action by the jet so as to form a pit in the surface of the die. By aligning the semiconductor die between a pair of opposed nozzles, pits directly opposite one another can be formed in the face of the die, either separately or by simultaneous action of a pair of jets each action on an opposite face.

In accordance with a specific embodiment of the invention, an etching electrolyte is employed which permits the contours of pits etched in germanium bodies to be controlled by the current density passing through the electrolyte impinged against them during the etching action. This composition is made of a solution of zinc sulphate, ammonium acetate and ammonium chloride. A particularly useful composition contains the ingredients in the following concentrations:

| | Grams per liter |
|---|---|
| Zinc sulphate (as $ZnSO_4.7H_2O$) | 25 |
| Ammonium acetate | 20 |
| Ammonium chloride | 25 |

Although as shown in Fig. 2 the emitter pit 44 is of a shallow, flat-bottomed contour and the collector pit 46 is of a deeper convex-bottomed shape, the pits are both etched using the same electrolyte of the specified composition but under different controlled conditions of current density, time and jet diameter. In order to form a round flat-bottomed emitter pit 44, a jet 0.008 inch in diameter and with a current of 2 milliamperes passing through it is directed against the N-type layer 42 through the aperture 20 for a period of 20 seconds. This results in a flat-bottomed pit 0.002 inch deep and 0.008 inch in diameter. An advantage of forming the emitter pit 44 by jet-etching is that the zinc layer 47 shown at the bottom of the pit in Fig. 2 can be formed simply by reversing the direction of the current in the electrolytic jet after the pit has been formed. As will be explained in more detail subsequently, the zinc layer 47 serves to limit and control the size and shape of the alloyed emitter regions subsequently formed. A satisfactory zinc layer is formed in a plating time of 5 seconds using a current of 0.75 milliampere through a jet of the same size and chemical composition as that employed in etching the emitter pit.

The collector pit 46 formed on the opposite side of the semiconductor die 21 is formed by jet-etching using the same electrolyte but with a jet of different diameter and employing a higher current density over a longer period of time. By employing the electrolyte composition specified, a collector pit having a convex bottom is formed by using a jet 0.010 inch in diameter and carrying a current of 6 milliamperes and directing it against the collector side of the die for 200 seconds. It will be noted for Fig. 2 that the collector pit 46 is much deeper than the emitter pit 14 passing entirely through the N-type layer 43 and into the P-type substrate 41. A convex projection 48 is formed in the bottom of the pit 46 in contrast to the essentially flat-bottom of the emitter pit 44. The difference in cavity contours is due to the difference in current density through the etching jets.

After the jet-etching of pit 46 is completed a zinc layer 49 is plated onto the projection 48 under the same conditions used to form the zinc layer 47.

In accordance with one embodiment of the invention and under the condition specified above, jet-etching of the collector pit is carried out only to the depth indicated in Fig. 2. The etching is thus carried only to the point where the bottom of the pit 46 is near the diffused junction 52 between N-type layer 42 and P-type substrate 41. In order to form a diffused collector junction having an area small relative to the area of the semiconductor die, the projection 48 of P-type germanium, which makes up the collector region, is electrically isolated from the rest of the P-type germanium in the substrate 41. This isolation may be accomplished by continuing the jet-etching step for a somewhat longer time. However, it has been found more convenient to carry out the final isolation of the collector region 48 in a separate step which is more easily controlled.

Following the formation of the pits 44 and 46, ohmic contact is made to the collector region 48 and an emitter junction electrode is formed in the pit 44. Both of these contacts are made by melting a small body of a suitable metal such as indium (or containing indium in alloyed form) positioned at the bottom of the respective pits as shown in Fig. 3. In the case of the emitter electrode, a metal capable of forming a rectifying junction with the germanium at the bottom of pit 44 is used. An indium ball 53 formed at the end of the indium plated nickel emitter lead wire 23 is positioned in the emitter pit 44 in contact with the zinc layer 47. In the particular embodiment described, the indium ball 53 is about 0.006 inch in diameter with the emitter lead wire 23 having a diameter of 0.002 inch. It is advantageous to coat the indium ball 53 with a suitable flux such as that manufactured by the Division Lead Company of Summit, Illinois under the designation "Divco No. 335." The indium ball 53 is melted by directing against it a jet of hot, non-oxidizing gas such as nitrogen, argon or carbon dioxide at a temperature between 350° and 400° C.

When the indium ball 53 is melted by the hot jet, it begins to flow over the zinc layer 47. Its spread is limited to the zinc covered area. The molten indium alloys with the zinc and this binary alloy in turn penetrates into the N-layer 422 to form a ternary alloy of germanium, zinc and indium which forms an emitter region of recrystallized material of P-type conductivity indicated at 56 in Fig. 4. The area of the emitter region 56 and of the emitter junction 57 formed between it and layer of N-type material 42 is coextensive in the area with the zinc plated region 47. This is because the zinc controls the spreading of the indium as it is melted which is believed to be due to the preferential wetting effect between indium and zinc. Because the area of the zinc layer 47 controls the area of the alloyed emitter junction 57, the alloying method facilitates production of alloyed junctions of reproducible size and hence reproducible electrical properties.

The portion of the melted indium which does not penetrate to the recrystallized alloyed region 56 forms the emitter button 24. The emitter lead 23 is secured to emitter mounting lead 17 as shown in Figs. 5 and 6 by soldering or welding.

Ohmic contact to the collector region 48 is made in a similar manner by placing indiuim ball 54 attached to indium plated nickel lead wire 27 against the zinc layer 49 on the surface of the collector region 488 and applying a jet of hot inert gas to melt the indium. The indium flows over the zinc layer 49 and is limited to that area forming the collector contact button 26, as shown in Fig. 3. Since collector region 48 is of P-type conductivity there is no rectifying junction formed by any alloyed region produced. The zinc layer 49 is used to control the spreading of the indium and to facilitate locating the ohmic contact in the precise position desired. Since the contact formed is ohmic, it does not effect the characteristics of the diffused collector junction 52 in any way. Other metals beside indium which are suitable for establishing ohmic contact with the collector region 48 may be used.

Although a preferred embodiment of the invention involves the use of the zinc layers 47 and 49, the invention may also be practiced in its broader aspects using other suitable methods of forming the alloyed emitter junction and the ohmic connection with the collector region. Thus, indium may be attached directly to the germanium or other metals appropriate for the purpose may be used to form the alloyed emitter junction and the ohmic connection. Also, in some embodiments of the invention, the emitter junction may be formed by plating an electrode of P-type metal such as zinc or indium onto the bottom of the emitter pit 44 thus establishing a rectifying junction with N-type layer 42.

The semiconductor die 21 is now in the condition shown in Fig. 3. In order to form a transistor of the desired low collector capacitance desired in devices adapted for high frequency application, the collector region 48 is isolated from the remainder of the P-type material making up the substrate layer 41. This isolation can be carried out easily and conveniently because of the contour of the collector pit 46 which provides the collector region 48 as an easily isolated projection. In accordance with a specific embodiment of this invention, isolation of the collector region 48 is accomplished by etching a re-entrant groove indicated at 58 in Fig. 4 which extends into the N-type layer 42 and around the periphery of the collector pit. Etching is accomplished by immersing the semiconductor die 21 in a ten percent aqueous solution of sodium hydroxide. The re-entrant groove 58 is formed by electrolytic etching making the collector region 48 the anode and using a nickel cathode immersed in the bath. The emitter side of the semiconductor die is masked with silicone grease to prevent its being etched. A potential of six volts is applied between the anode and cathode for five second intervals with the unit being tested for reverse collector saturation current at the end of each interval. When sufficient etching has taken place so that the re-entrant groove 58 penetrates to the N-base region 42 thus isolating collector region 48, a stable collector reverse saturation current of 20 microamperes or less is obtained.

The partially assembled transistor unit is then subjected to the final electrical tests, vacuum dried and enclosed in the can 31. The configuration of the various conductivity zones in the semiconductor die 21 in the completed transistor is illustrated in Fig. 4.

The transistor of this invention possesses a number of highly desirable operating characteristics. One such characteristic is its ability to operate at much higher power levels than conventional high speed switching transistors. Heretofore, such transistors have been limited to relatively low power range of 10 to 25 milliwatts. At higher levels these transistors have been damaged or destroyed by overheating as a result of heat generated during their operation. The transistor of this invention, however, is consistently capable of successful operation at a power level of 150 milliwatts and in some instances at 250 milliwatts. This is because of the superior heat dissipating properties of the transistor due to the effective heat transfer provided by the members 28 and 29 which transfer heat generated during operation of the transistor from the semiconductor die 21 through the base strip 19 to the mounting base 11. So effective are the heat transfer members 28 and 29 in conducting heat from the junctions of the semiconductor die that a temperature rise of only 0.2° C. per milliwatt has been obtained at operation of typical transistors made in accordance with this invention.

Because of the extreme thinness of the base layer 42 coupled with the small collector capacitance that can be obtained by providing a small area collector junction 52, transistors of the present invention have excellent high frequency characteristics. Table I below are some typical high frequency measurements on typical units made in accordance with the present invention. The data in Table I was obtained in using a collector voltage of 12 volts and a collector current of 1 milliampere.

*Table I*

| Unit No. | $C_o$ μμfd. | Beta | | Power Gain, db | | | | $f$ Max Mc/Sec. |
|---|---|---|---|---|---|---|---|---|
| | | 1Kc | 0.5mc | .5Mc | 12.5Mc | 30Mc | 70Mc | |
| 43 | 1.5 | 40 | 39 | 43.0 | 30.0 | 21.5 | 14.0 | 180 |
| 80 | 1.0 | 26 | 26 | 38.5 | 31.0 | 22.5 | 15.0 | 210 |
| 95 | 1.8 | 78 | 68 | ------ | 31.5 | 23.0 | 15.0 | 205 |

Transistors of the present invention also have excellent high speed switching characteristics. This is believed to be due in part to the use of a relatively high resistivity collector region and a relatively low resistivity base region leading to independence of the effective base width of the transistor with respect to voltage drop across it. The resistivity of the base region is referred to as relatively low since it is lower than that of the collector region. The collector region 48 is formed of germanium having a resistivity of at least 10 ohm-centimeters and preferably at least about 20 ohm-centimeters. At the diffused junction 52, the resistivity of base region 42 is about the same as that of the collector region but, its value falls off rapidly to about 0.001 ohm-centimeters at the outer surface of the semiconductor die. This is due to the graded concentration of donor-type impurities in the base region, the concentration being higher remote from the junction 52. Since the resistivity of base region 42 varies from a value no higher than that of collector region 48 to a much lower value, the former is referred to as a region of lower resistivity or of relatively low resistivity.

Because of its graded resistivity, the base region 42 is provided with an electrical field which accelerates carriers injected at the emitter on their passage to the collector. This contributes to the effectiveness of the present invention as a high speed switching transistor.

In the past, PNIP transistors which have found application in high speed switching have been limited in their use since they were characterized by very large storage time of carriers and by slow recovery time when the voltage across the device is low as when it is in or over saturation or at low collector voltages. Hole storage and recovery times control the speed at which switching can be accomplished and are desirably as short as possible.

"Hole storage time" refers to a figure-of-merit measurement common in evaluating switching transistors. It is the amount of time an output pulse from a transistor driven into saturation tends to hold up to its switched value after the driving pulse is turned off. It is expressed as the time from the end of the driving pulse to the point where the pulse voltage lowers to 90% of its switched value. "Recovery time" is the time from the end of the driving pulse until the transistor output is reduced to 10% of its switched value. The undesirably high times for these parameters in PNIP transistors operated at saturation are believed to be due to effective widening of the base region when the space charge region does not extend completely across the intrinsic region from the collector which condition occurs at low collector voltages.

However, transistors made in accordance with the present invention have an effective base width relatively independent of the voltage drop across them and of variations in collector voltage because the space charge layer resulting from the application of collector bias extends from collector junction 52 into the high resistivity collector region rather than into the low resistivity base region. The base region 42 can extend only as far as the collector junction 52 (at which point carriers from emitter 24 are collected) and hence is independent of the width of the space charge region unlike the base region of a PNIP transistor. Since the base region 42 is a diffused layer it can be made thin and, in accordance with the invention, can be maintained effectively thin. As a result, the transistors are characterized by low storage time of carriers (holes in the case of PNP transistors) and quick recovery times. Table II below indicates the superiority of transistors made in accordance with the present invention over prior switching transistors of the PNIP type with respect to hole storage times and recovery times for units operated at 6 db over saturation and hence with a low voltage drop across them.

*Table II*

| PNP Transistor (Made in accordance with this invention) | | | | PNIP Transistor | | | |
|---|---|---|---|---|---|---|---|
| Unit No. | Rise Time | Hole Storage Time | Recovery Time | Unit No. | Rise Time | Hole Storage Time | Recovery Time |
| | Millimicroseconds | | | | Millimicroseconds | | |
| 34 | 7 | 10 | 40 | 325 | 8.5 | 160 | 280 |
| 38 | 7.5 | 10 | 50 | 326 | 7.5 | 140 | 250 |
| 40 | 7 | 20 | 40 | 330 | 7 | 170 | 270 |
| 43 | 7 | 10 | 40 | 335 | 8.5 | 140 | 250 |

Transistors of this invention operate successfully over a wide range of collector voltages. In typical units, the common emitter current gain is virtually independent of collector voltages at low currents for collector voltages between two and twenty volts. Also, the rise time does not increase appreciably with increased driving pulse at collector voltages in the range between 1.5 and 45 volts. Both of these characteristics are believed to be due, at least in part, to the independence of the effective base width of the transistor with respect to collector voltages.

The present invention provides a high speed, high frequency switching transistor whose improved structure and mounting in conjunction with a pair of L-shaped heat dissipating members enhances its heat transfer characteristics. This permits its effective operation at high power levels with adequate transfer of heat away from its junctions. Configuration of the semiconductor die, which is characterized by small isolated collector region of high resistivity separated from the base region of lower resistivity by a diffused rectifying junction, provides a transistor of low collector capacitance. This, combined with thinness of the base region, permits the resulting transistor to be used successfully for both high speed switching and high frequency applications. The use of jet-etching techniques, particularly in the formation of the collector pit, enables the transistor to be manufactured easily and conveniently and facilitates formation of a diffused collector junction of small and accurately controllable area.

Although the invention has been described with respect to a PNP transistor, it will be understood that it may also be applied to the making of an NPN device.

Successful operation of the transistor of the present invention at relatively high collector voltages is made possible by its high punch-through voltage. The juxtaposition of the high resistivity collector region 48 and the base region 42 whose resistivity decreases rapidly in a direction away from junction 52 effects a preferential spreading of the space charge region into the collector region with relatively little spreading into the base region. The graded resistivity of base region 42 provides progressively greater resistance to the advance of the space charge region the closer the space charge approaches the emitter 24 so that high collector voltages may be applied without causing punch-through. This enables the base region 42 to be made thin to provide a transistor having good high frequency response without lowering punch-through voltage to an undesirable level.

We claim:

1. In a transistor, a semiconductor body including in combination, a layer of semiconductor material of a first conductivity type and a layer of semiconductor material of the opposite conductivity type formed by diffusion of a conductivity modifying impurity into the first conductivity type material, a first region of material of the first conductivity type in said body electrically isolated from the rest of the material of the same conductivity type in said layer thereof, a diffused rectifying junction formed between the isolated first region of said first conductivity type and said material of said opposite conductivity type and a second region of material of said first conductivity type formed by alloying a conductivity modifying impurity into said layer of semiconductor material of said opposite conductivity type to form an alloyed rectifying junction.

2. In a transistor, a semiconductor body including in combination, a layer of P-type semiconductor material and a layer of N-type semiconductor material formed by diffusion of a donor-type impurity into said P-type semiconductor material, a first region of P-type semiconductor material in said body electrically isolated from the rest of the P-type semiconductor material in said layer thereof, a diffused collector junction of small area as compared to the area of said semiconductor body, said diffused collector junction formed between said isolated region of P-type semiconductor material and said N-type semiconductor material and a second region of P-type semiconductor material formed by the alloying of an acceptor-type impurity into said layer of N-type semiconductor material to form an alloyed emitter junction.

3. A transistor including in combination, a semiconductor die including a layer of P-type germanium and a layer of N-type germanium formed by diffusion of a donor-type impurity into P-type germanium, means forming an emitter pit in said N-type layer, an emitter electrode alloyed to said die at the bottom of the emitter pit and forming an alloyed emitter junction with said N-type layer, means defining a collector pit in said P-type layer, a projection of P-type germanium at the bottom of the collector pit, said projection extending from said layer of N-type germanium and being electrically isolated from the main body of P-type germanium in said die, a diffused collector junction formed between said projection and said layer of N-type germanium and means forming an ohmic contact with said projection.

4. A transistor for use in high frequency and high speed switching applications including in combination, a semiconductor die having a layer of P-type germanium of a resistivity of at least about 10 ohm-centimeters and a layer of N-type germanium of a lower resistivity formed by vapor diffusion of a donor-type impurity into P-type germanium, means forming an emitter pit in said N-type layer, an indium-containing alloyed emitter region formed at the bottom of the emitter cavity, means forming a collector pit in said P-type layer, means forming a peripheral groove in the bottom of the collector pit and extending into said N-type layer, a projection of P-type germanium at the bottom of the collector pit constituting a collector region, said projection extending from said N-type layer and being electrically isolated from the main body of P-type germanium in said die, a small area diffused collector junction formed between said projection and said N-type layer, and means forming an ohmic contact with said projection.

5. A transistor for use in high frequency and high speed switching applications including in combination, a semiconductor die having a layer of P-type germanium of a resistivity of about 20 ohm-centimeters and a layer of N-type germanium adjacent said P-type layer formed by vapor diffusion of a donor-type impurity into P-type germanium, the resistivity of said N-type layer being graded from about 20 ohm-centimeters adjacent said P-type layer to 0.001 ohm-centimeters in the portion of said N-type layer remote from said P-type layer, said die having an emitter pit jet-etched in said P-type layer, an indium-containing alloyed emitter region formed in said die at the bottom of the emitter pit, said die further having a collector pit formed at least partially by jet-etching in said P-type layer opposite the emitter pit, means forming a peripheral groove in the bottom of said collector pit and extending into said N-type layer, a projection of P-type germanium at the bottom of the collector pit constituting a collector region, said projection extend from said N-type layer and being electrically isolated by the groove from the main body of P-type germanium in said die, a small area diffused collector junction formed between said projection and said N-type layer, and means forming an ohmic contact with said projection.

6. A transistor for high frequency and high speed switching application and adapted for operation at a power level of about 150 milliwatts, said transistor including in combination, a semiconductor die having a small area diffused rectifying collector junction, a collector region of relatively high resistivity, a base region of lower resistivity and an alloyed rectifying emitter junction, an elongated flat conductive base strip with said die carried on said strip and in heat exchange relation and ohmic contact with said strip, a mounting base including an upper surface of conductive metal and a plurality of upright mounting leads extending above said base, said strip being secured at its ends between two of said mounting leads, a pair of L-shaped heat dissipating members made of a heat conductive metal and each having a pair of relatively wide, flat perpendicular legs with one leg of each member being secured along said strip adjacent one end thereof to form a relatively large area heat exchange contact therewith with the other leg of said member being secured to said metal upper surface of said mounting base to form a relatively large area heat exchange contact therewith so that heat generated at said rectifying junctions of said transistor during operation thereof is effectively transferred from said semiconductor die.

7. A method of making a transistor including in combination, the steps of providing a semiconductor body having a substrate of one conductivity type and a surface layer of the opposite conductivity type with a first rectifying junction formed between said substrate and said layer, forming a second rectifying junction in said layer of the opposite conductivity type, electrically isolating a portion of the substrate adjacent said first rectifying junction from the main body of said substrate, and providing an ohmic connection with the electrically isolated portion.

8. A method of making a transistor including in combination the steps of providing a semiconductor body having a high resistivity substrate of one conductivity type and a surface layer of the opposite conductivity type and of lower resistivity on one surface of said body with a first rectifying junction formed between said substrate and said layer, forming a second rectifying junction on the surface layer of lower resistivity, electrically isolating a portion of said high resistivity substrate adjacent said first rectifying junction from the main body of said substrate and providing an ohmic connection with the electrically isolated portion.

9. A method of making a transistor including the steps of diffusing a donor-type impurity into a body of P-type semiconductor material to form adjacent P and N-type layers, forming a first pit in said N-type layer, forming a second pit in said P-type layer with the periphery of the second pit bottom extending into said N-type layer to form a projection of P-type material opposite said first pit, and forming an alloyed region of P-type semiconductor material within said first pit.

10. A method of making a transistor including the steps of diffusing a donor-type impurity into a die of P-type germanium to form adjacent P and N-type layers, jet-etching an emitter pit in said N-layer, jet-plating a layer of zinc at the bottom of the emitter pit, alloying an indium-containing body positioned in said pit into said die to form an alloyed region of P-type conductivity material which region forms an alloyed emitter junction wtih said N-type layer, jet-etching a collector pit in said P-type layer, said pit having a convex bottom with a central projection of P-type germanium formed therein, forming a groove around said projection with the groove extending into said N-layer to electrically isolate said central projection of P-type germanium from the other P-type germanium in said die with a diffused collector rectifying junction between said projection and said N-type layer and providing an ohmic connection with said projection.

11. A method of making a transistor including the steps of diffusing a donor-type impurity into a die of P-type germanium to form adjacent P and N-type layers, jet-etching an emitter pit in said N-layer, jet-plating a layer of zinc at the bottom of said emitter pit, alloying an indium-containing body positioned in said emitter pit to form an alloyed region of P-type conductivity material which region forms an alloyed emitter junction with said N-type layer, jet-etching a collector pit in said P-type layer so that said collector pit has a convex bottom with a central projection of P-type germanium formed therein, electrolytically etching a groove around said central projection with the groove extending into said N-layer to electrically isolate said central projection of P-type germanium from the other P-type germanium in said die, with a diffused rectifying collector junction formed between said projection and said N-type layer, connecting an indium-containing body to said central projection to establish an ohmic connection therewith, and securing a base connection in ohmic connection along said N-type layer.

12. A method of making a semiconductor unit for a transistor including the steps of providing a semiconductor body of one conductivity type, vapor diffusing a conductivity modifying impurity into said semiconductor body to form a diffused layer of opposite conductivity type and a substrate layer of said one conductivity type with a first rectifying junction therebetween, forming a second rectifying junction in said diffused layer, and removing a selected portion of said substrate layer and said first rectifying junction from said semiconductor body to form a projection on said diffused layer including an active collector region and an active collector junction of predetermined cross-sectional area.

13. A method of making a semiconductor unit for a transistor including the steps of providing a semiconductor body having a first layer of one conductivity type and a second layer of opposite conductivity type with a first rectifying junction between said layers, forming a second rectifying junction in said first layer, and selectively etching a portion of said second layer and said first rectifying junction to form a projection including an active collector region and an active collector junction of predetermined area.

14. A method of making a semiconductor unit for a transistor including the steps of providing a semiconductor body having a substrate layer of one conductivity type and a surface layer of opposite conductivity type with a first rectifying junction between said layers, forming a second rectifying junction in said surface layer, and etching a loop-shaped channel through one of said layers and said first rectifying junction, thereby isolating a projection including an active conductivity region and an active rectifying junction of predetermined area.

15. A method of making a semiconductor unit for a transistor including the steps of providing a semiconductor body of one conductivity type, vapor diffusing a conductivity modifying impurity into said semiconductor body to form a diffused layer of opposite conductivity type and a substrate layer of said one conductivity type with a first rectifying junction therebetween, forming a second rectifying junction in said diffused layer, and etching a loop-shaped channel through said substrate layer and said first rectifying junction, thereby isolating a projection including an active collector region and an active collector junction of predetermined area.

16. In a transistor, a semiconductor body including in combination, a first layer of semiconductor material of one conductivity type, a second layer of semiconductor material of opposite conductivity type, a diffused rectifying junction between said layers, and a rectifying emitter junction on one of said layers, said body having a channel of predetermined loop-shaped configuration extending through said first layer and said rectifying junction into said second layer to electrically isolate a portion of the material of said first layer from the remainder of the material thereof and define a collector junction of predetermined area between said layers.

17. In a transistor, a semiconductor unit including in combination, a substrate layer of semiconductor material of one conductivity type, a diffused layer of semiconductor material of opposite conductivity type forming a diffused rectifying junction with said substrate layer, a region of semiconductor material of said one conductivity type forming another rectifying junction with said diffused layer, said layers each having an outer surface and one of said layers having an endless channel extending from said outer surface thereof through the same and through said diffused rectifying junction, thereby electrically isolating an island including an active conductivity region and an active collector junction of predetermined area, and a thermally conductive member attached to the outer surface of the other of said layers and cooperating therewith to provide a heat sink.

18. In a transistor, a semiconductor unit including in combination, a substrate layer of semiconductor material of P-type conductivity with relatively high resistivity, a diffused layer of semiconductor material of N-type conductivity having an outer surface and forming a first rectifying junction with said substrate layer, said diffused layer having a resistivity range graded from a value adjacent said outer surface substantially lower than the resistivity of said substrate layer to a higher value adjacent said first rectifying junction, one of the aforesaid layers having an endless channel extending therethrough and through said first rectifying junction to electrically isolate a portion of the semiconductor material of said one layer from the remainder of the material thereof, an electrode including an emitter region of P-type semiconductor material forming a rectifying emitter junction with said diffused layer, and an ohmic connection to each of said layers and said electrode.

19. In a transistor, a semiconductor body including in combination, a diffused layer of semiconductor material of one conductivity type having an outer surface, said diffused layer providing a base region with a graded resistivity range, an electrode on a small area of said outer surface including an emitter region of semiconductor material of opposite conductivity type forming a rectifying emitter junction with said diffused layer, and an isolated layer portion projecting from said diffused layer opposite said rectifying emitter junction, said layer portion having a transverse cross-section of predetermined area smaller than the corresponding cross-section of said diffused layer and including a collector region of semiconductor material of said opposite conductivity type, said collector region having a resistivity above said resistivity range of said diffused layer and forming a collector junction with said diffused layer, and a thermally conductive member attached to said outer surface of said diffused layer and having a relatively large area of contact therewith to provide effective conduction of heat away from said collector junction.

20. A transistor including in combination, a semiconductor unit having a diffused base layer, a collector layer, and an emitter region forming a rectifying emitter junction with said base layer, one of said layers including a portion isolated from the remainder thereof forming a small area collector junction with the adjoining layer, and the other of said layers having a relatively large mounting area, an elongated flat strip of electrically and thermally conductive material, said semiconductor unit being carried on said strip with said mounting area in heat exchange relation and ohmic contact therewith, a base including a mounting surface of electrically conductive metal, and a plurality of upright leads extending above said mounting surface, said strip being secured on at least one end to one of said leads and providing effective conduction of heat away from said junctions, thereby increasing the power capabilities of said transistor.

References Cited in the file of this patent

UNITED STATES PATENTS

| | | |
|---|---|---|
| 2,603,693 | Kircher | July 15, 1952 |
| 2,810,870 | Hunter et al. | Oct. 22, 1957 |
| 2,811,653 | Moore | Oct. 29, 1957 |
| 2,830,920 | Colson et al. | Apr. 15, 1958 |